United States Patent [19]

Chang et al.

[11] Patent Number: 5,147,848

[45] Date of Patent: Sep. 15, 1992

[54] PRECIPITATION PROCESS FOR FORMING BI-PB-SR-CA-CU-O SUPERCONDUCTORS BY DISSOLVING NITRATE SALTS IN ACID AND ADDING A SOLUTION OF TRIETHYLAMINE AND OXALIC ACID

[75] Inventors: Chau-Ting Chang, Hsinchu; Cheng-Yei Shei, San Chung; Ru-Shi Liu, Hsinchu, all of Taiwan

[73] Assignee: Industrial Technology Research Institute, Taiwan

[21] Appl. No.: 551,629

[22] Filed: Jul. 11, 1990

[51] Int. Cl.⁵ .............................................. H01L 39/12
[52] U.S. Cl. ........................................ 505/1; 505/737; 505/782; 505/738; 252/521; 423/593
[58] Field of Search .................... 505/1, 782, 737, 738; 252/518, 521; 423/593

[56] References Cited

U.S. PATENT DOCUMENTS

| | | | |
|---|---|---|---|
| 4,804,649 | 2/1989 | Sherif | 505/802 |
| 4,880,771 | 11/1989 | Lava et al. | 505/809 |
| 4,895,832 | 1/1990 | Chang et al. | 505/1 |
| 4,898,851 | 2/1990 | Michel | 505/1 |
| 5,001,109 | 3/1991 | Spencer | 505/738 |
| 5,045,527 | 4/1991 | Ikeno et al. | 505/1 |

FOREIGN PATENT DOCUMENTS 64-5947  1/1989  Japan .

OTHER PUBLICATIONS

Kayser et al., "Effects of Coprecipitation Conditions and Processing or Powder Stoichiometry and Properties of Oxalate derived High-$T_c$ $YBa_2Cu_3O_{7-x}$ Ceramics", *Ceram. Trans.* vol. 12, 1990.

Shei et al., "Coprecipitation Process for the Preparation of Superconductive Bi-Sr-Ca-Cu Oxides", *Mat. Lett.* vol. 9, No. 2, Jan. 3, 1990.

Shei et al., "Preparation and Characterization of Superconducting $(Bi_1Pb)_2Sr_2Ca_2Cu_3$ Oxides with Tc ... ", *Inorg. Chem.* vol. 29, pp. 3117-3119, 1990.

Pramanik P.; "Preparation of Superconducting Ceramic Oxides by Co-Precipitation ... From Mixed Solvent", *Progress in Reviews High Temperature Superconductivity*, vol. 16, May 2-4, 1988.

Clark et al., "Oxalate Precipitation Methods for ... Superconducting Compound", *High-Temp Superconducting Mat.* 1988.

Primary Examiner—A. Lionel Clingman
Assistant Examiner—Bradley A. Swope
Attorney, Agent, or Firm—Scully, Scott, Murphy & Presser

[57] ABSTRACT

A process for preparing powder of high temperature oxide superconductors of Bi-Pb-Sr-Ca-Cu-O type. In an aqueous solution of nitrate salts of Bi, Pb, Sr, Ca, and Cu metals, an appropriate ratio of triethylamine/oxalic acid was added to form a coprecipitate. Through the process of calcination at a temperature in the range of 750° C. to 800° C. and sintering at a temperature of 860° C., a uniform and fine powder superconductive metal oxide having a critical temperature of 110K is obtained as the final product.

3 Claims, 7 Drawing Sheets

PRECIPITATION PROCESS FOR FORMING BI-PB-SR-CA-CU-O SUPERCONDUCTORS BY DISSOLVING NITRATE SALTS IN ACID AND ADDING A SOLUTION OF TRIETHYLAMINE AND OXALIC ACID

BACKGROUND OF THE INVENTION

The present invention is a process for preparing powder of high temperature oxide superconductors of Bi-Pb-Sr-Ca-Cu-O type.

In conventional processes, high temperature metal oxide superconductors are prepared by conventional solid state reaction. That is, the oxides or carbonates of the metal moieties ultimately desired in the final metal oxide superconductors are mixed in an appropriate ratio, ground, calcined, and sintered to obtain oxide superconducting materials. However, the final product obtained in this conventional process is a coarse powder (grain size larger than 1 um) and poor in uniformity, which seriously affects its subsequent applications.

The drawbacks of the above process can be improved by employing a method of metal co-precipitation in which more uniform in size and finer particulates of precursor powder can be obtained. In this process, oxalate precipitation reagent is added to an aqueous solution comprising soluble salts of the desired metals. Sodium hydroxide (or potassium hydroxide) is added to the solution to adjust its pH value in order to form oxalate co-precipitants of the Bi-Pb-Sr-Ca-Cu-O mixture. The coprecipitant is then filtered, dried, and sintered. The addition of sodium and/or potassium hydroxide to the solution will simultaneously change its pH. Although the co-precipitant can be obtained rapidly, the co-precipitate is not uniform. Besides, due to the residue of the sodium and/or potassium ions, the superconductivity of the products thus obtained is affected. Sometimes, ammonium oxalate is used as the precipitant reagent, however the pH of the solution cannot be adjusted. Thus, in this conventional process, the proportion of individual components of co-precipitate are rather difficult to be controlled, and the process is inappropriate for use in mass production.

SUMMARY OF THE INVENTION

Therefore, it is an objective of the present invention to provide a method for forming oxide superconductor of Bi-Pb-Sr-Ca-Cu-O which can mitigate the drawbacks of the above mentioned conventional method.

It is an objective of the present invention to provide a method for forming oxide superconductor of Bi-Pb-Sr-Ca-Cu-O, wherein the ratio of the respective metal components can be easily controlled.

Another objective of the present invention is to provide a method for forming oxide superconductor of Bi-Pb-Sr-Ca-Cu-O, wherein the superconducting critical temperature is 110K.

It is still another object of the present invention to provide a method for forming oxide superconductor of Bi-Pb-Sr-Ca-Cu-O, wherein the superconducting material is very fine and of uniform particle size.

It is also an objective of the present invention to provide a method for the forming of oxide superconductor of Bi-Pb-Sr-Ca-Cu-O, wherein the concentration of the solution can be controlled.

These and other objectives, advantages and features of the present invention will be more fully understood and appreciated by reference to the written specification.

BRIEF DESCRIPTION OF THE DRAWINGS

The present invention will be further explained with reference to the annexed drawings, in which.

DETAILED DESCRIPTION OF THE INVENTION

The present invention relates to a process of forming oxide superconductor of Bi-Pb-Sr-Ca-Cu-O, in which the nitrate salts of Bi, Pb, Sr, Ca, and Cu metal moieties desired in the final superconductor composition are dissolved in nitric acid solution, and pouring it into solution containing an appropriate amount of pre-mixed triethyl amine/oxalic acid to form a co-precipitate. After the co-precipitate is filtered, the obtained product is calcined and sintered at a temperature in the range of 800° C.–860° C. A very fine and uniformly sized powder of oxide superconductor is obtained.

In accordance with the present invention, the process for forming oxide superconductor of the Bi-Pb-Sr-Ca-Cu-O comprises:

(1) Preparation of Metal Nitrate Aqueous Solution:

1.698 g of $Bi(NO_3)_3$ $5H_2O$, 0.4971 g of $Pb(NO_3)_2$, 1.059 g of $Sr(NO_3)_2$ 1.182 g $Ca(NO_3)_2$ $4H_2O$ and 1.1812 g of $Cu(NO_3)_2$ ) $3H_2O$ are mixed in 10 ml of a 1.6M Nitric acid solution. Stir the solution until the components are thoroughly dissolved.

(2) Preparation of triethylamine/oxalic acid:

4.098 g of oxalic acid is dissolved in 50 ml of water. Triethyl amine is added to the solution in the following ratio:

| Ratio | Triethylamine (ml) |
| --- | --- |
| 1 | 4.5 |
| 1.5 | 6.8 |
| 1.8 | 8.1 |
| 2.0 | 9.1 |
| 2.2 | 9.9 |
| 2.5 | 11.4 |
| 3.0 | 13.5 |

(3) Coprecipitation:

Metal nitrate solution is added slowly into triethyl amine/oxalic acid solution. The solution is stirred, and a light blue precipitate forms. After the mixing is fully complete, the suspended solution is filtered.. The solid blue precipitates are collected and placed in an oven to dry at 120° C. for 6 hours, after which a powdery form is obtained.

(4) Calcination:

The above obtained product is placed in a high temperature oven and calcined at 800° C. for 10 hours.

After calcination, the black solid is ground and compacted into a disc-shaped pellet of 0.5 g.

(5) Sintering:

The above disc pellet is sintered at 860° C. for 72 hours until a very fine powdery metal oxide superconductive material is produced.

Figure 1:
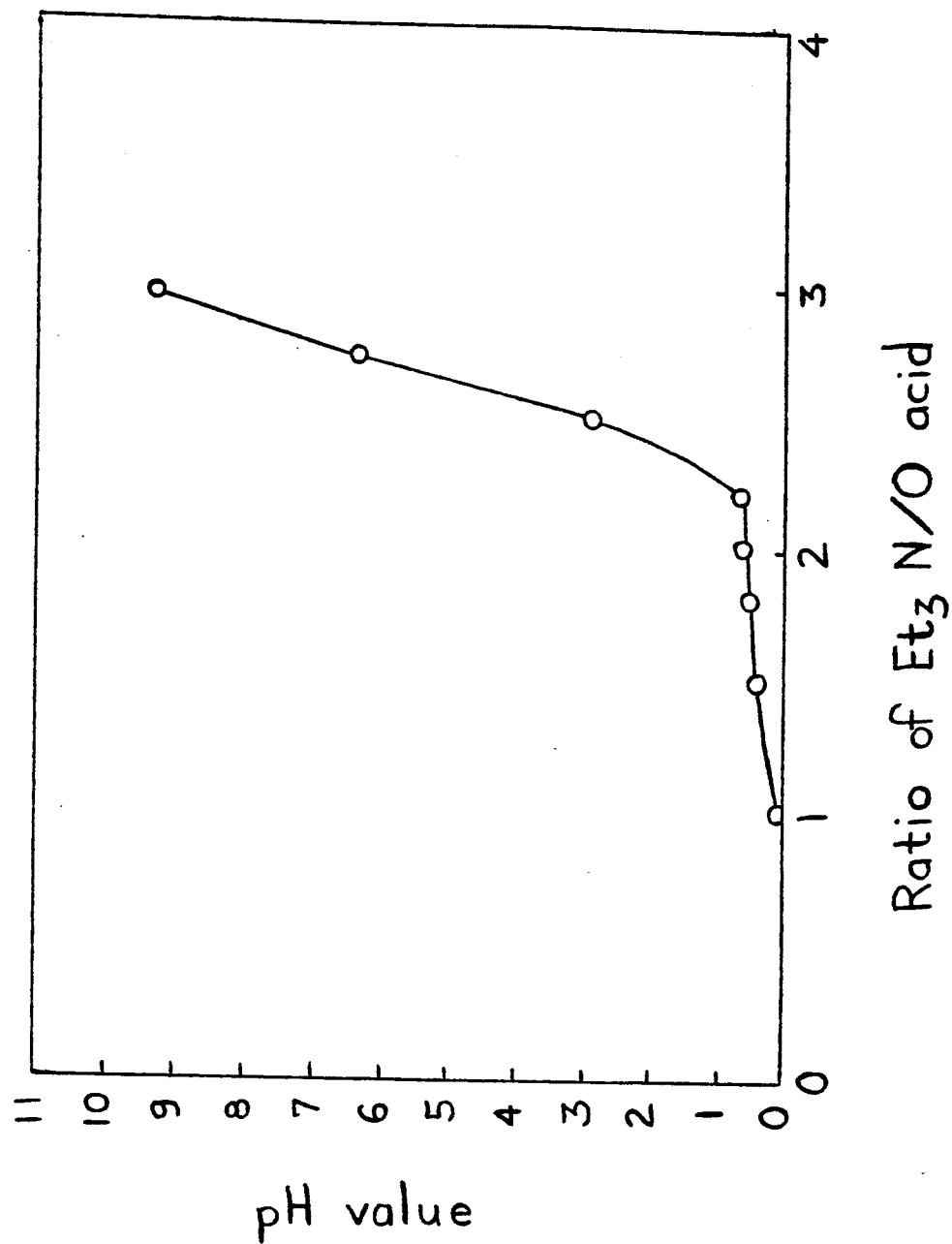
FIG. 1 illustrates the variation of pH value of the residual solution for different ratios of triethyl amine/oxalic acid after the precipitation of metallic ions.
Figure 2:
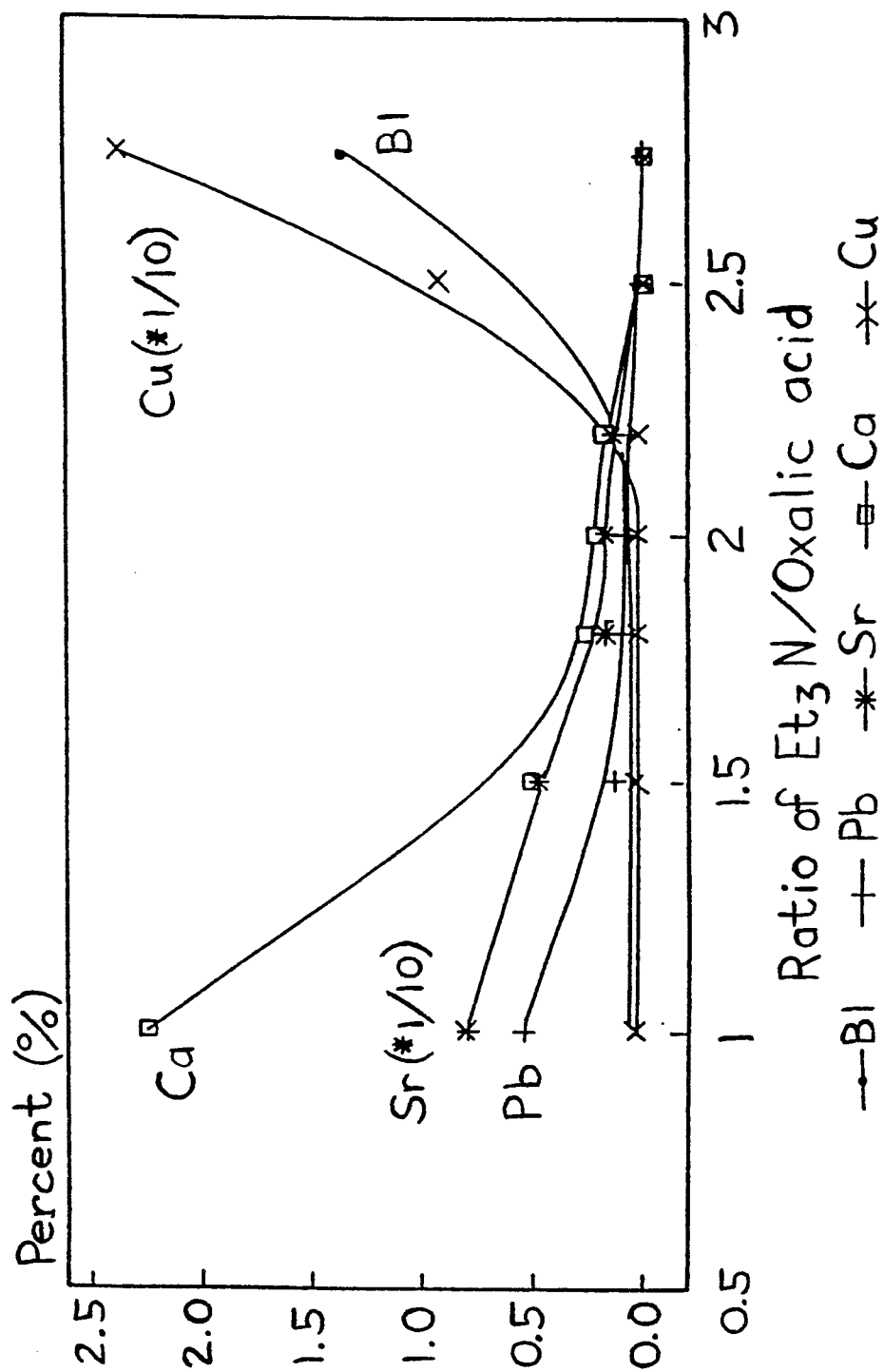
FIG. 2 illustrates the residual ratio of metal ions in the residual solution after the filtration of the solution.

In accordance with the present invention, the nitrate salts of Bi, Pb, Sr, Ca, and Cu metals are dissolved in nitric acid solution to form an aqueous solution. Well-mixed triethyl amine/oxalic acid mixed solution, with various molar ratios (1 to 3), is added gradually. The pH of the solution varies immediately after the addition of said mixed solution. As shown in FIG. 1., when the molar ratio of triethyl amine/oxalic acid is between 1 to 2, the variation in pH is rather small. The variation of pH is large when the triethyl amine/oxalic acid ratio is above 2.1. ICP-AES (Inductively Coupled Plasma Atomic Emission Spectrometry) is used to detect the residual metallic ion concentration and the results calculated with respect to the original weight and ratio of triethyl amine/oxalic acid are represented in FIG. 2. From this figure, the amount of residual metallic ions is different for various ratios of triethyl amine/oxalic acid, but it is obvious that the amount of individual residual metal ions is the least for the ratio around 1.8 to 2.2, which indicates that uniform co-precipitate close to the original ratio can be obtained. The obtained precipitant is dried at 140° C. and a very fine powder (of about 0.3 um) is formed.

Figure 3:
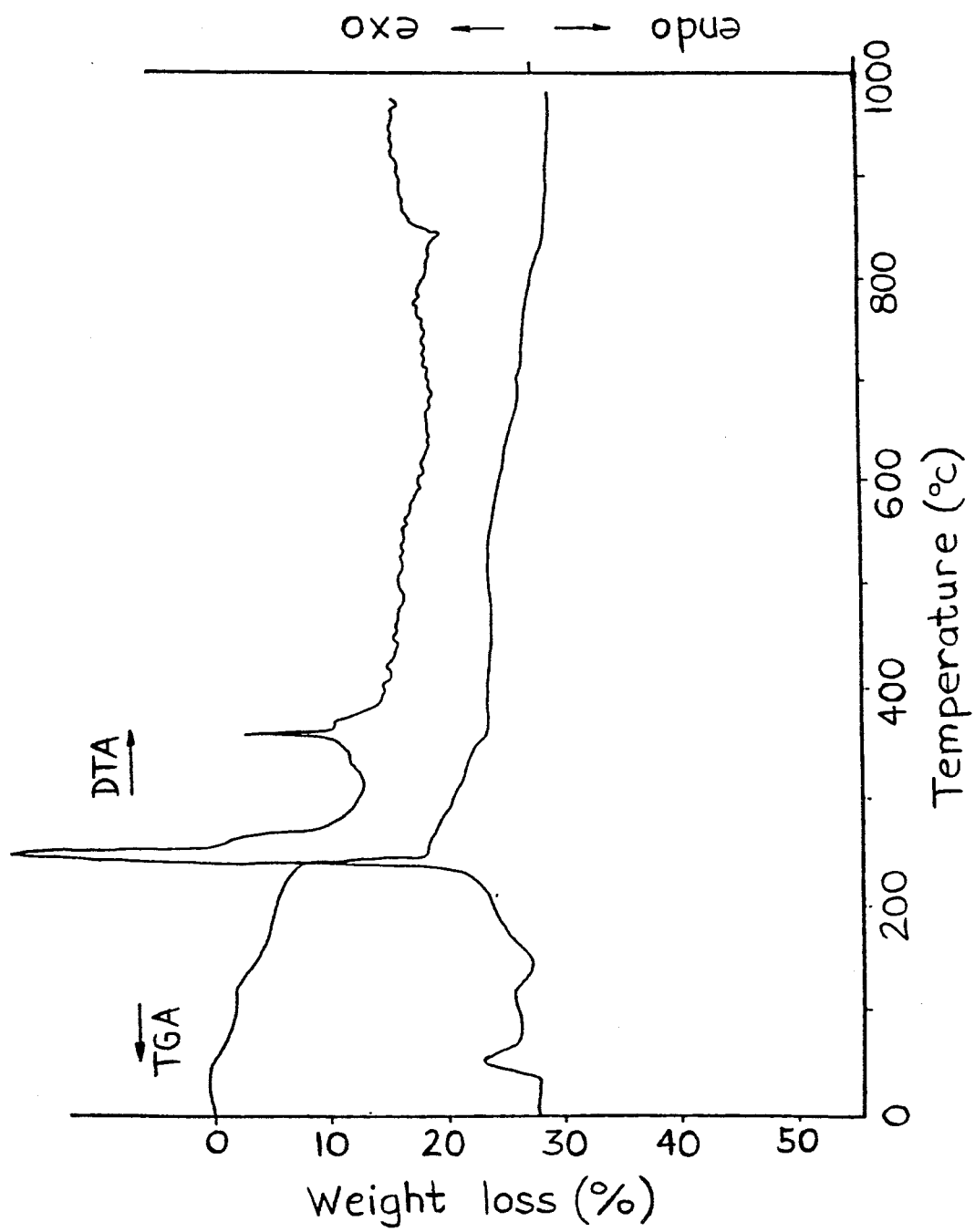
FIG. 3 illustrates the thermogravimetric analysis and differential thermal analysis for the obtained precipitant in accordance with the present invention.
Figure 4:
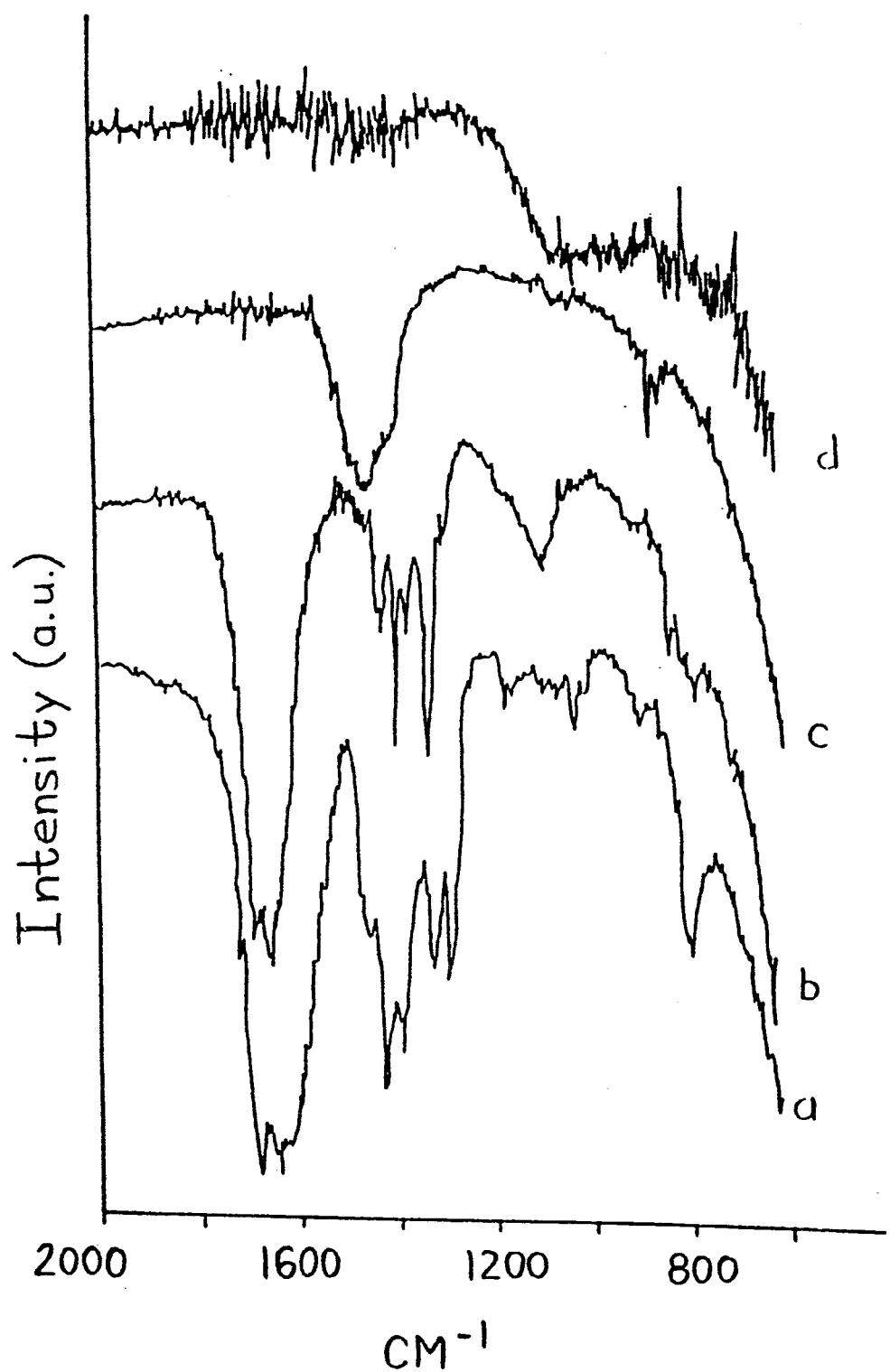
FIG. 4 illustrates the IR absorption spectrum for the precipitant after being sintered for 2 hours at various temperatures (a:140° C., b:200° C., c:450° C., d:800° C.)
Figure 5A:
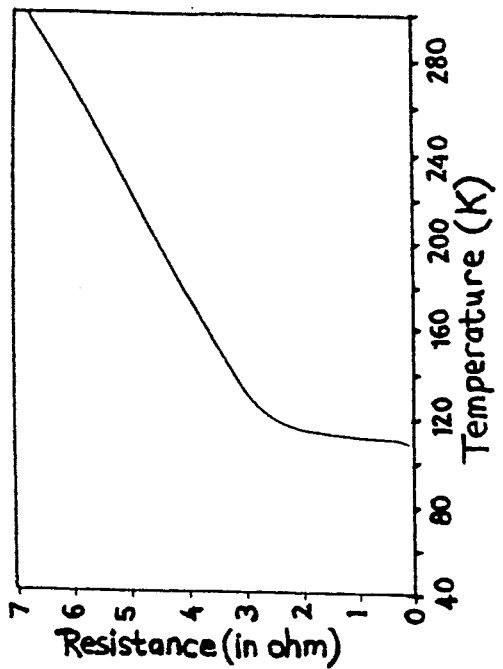
FIG. 5 illustrates the relationship between the temperature and resistance for the superconductor obtained with various triethyl amine/oxalic acid ratios (a:1.5, b:1.8, c:2.0, d:2.2) in accordance with the present invention.
Figure 5B:
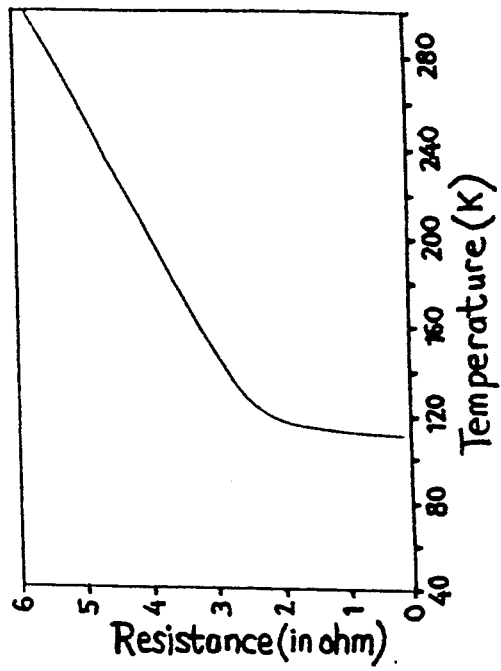
Figure 5C:
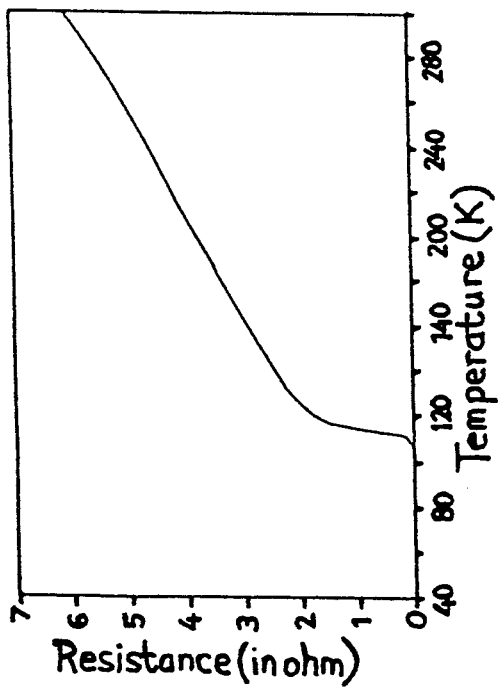
Figure 5D:
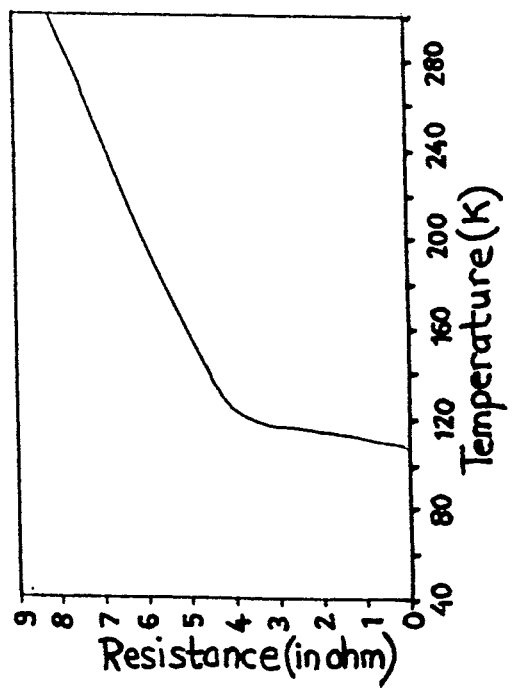

The thermal characteristics of the coprecipitate in accordance with the present invention are determined with a thermogravimetric analyzer and differential thermal analyzer. As shown in FIG. 3, a significant weight loss is observed at 400° C. The corresponding high peaks of exothermic reaction indicate that the major portion of the organic moiety has been decomposed. The product is then heated at four selected temperatures (140° C., 200° C., 450° C., and 800° C.) for 2 hours and the IR absorption spectra are illustrated in FIG. 4. This figure illustrates the absorption characteristics of the oxalate salts. From the figure, signals for oxalate can be seen at 1650 $cm^{-1}$, 1300 $cm^{-1}$, 800 $cm^{-1}$. No IR absorption signal for triethyl amine is observed, which indicates that the cations of triethyl amine do not remain in the co-precipitate. When the precipitant is heated at 200° C. for 2 hours (as shown in FIG. 4b), the metallic oxalate salts gradually decompose. As a result, the absorption at 1650 $cm^{-1}$ gradually weakens. When the temperature is increased to 450° C. (as shown in FIG. 4c), the oxalate salt gradually decomposes into bismuth oxide, copper oxide, lead oxide, calcium carbonate, and strontium carbonate. The existence of calcium carbonate and strontium carbonate can be seen at 1450 $cm^{-1}$, and 850 $cm^{-1}$. When the temperature is increased to 800° C., the individual oxides and carbonates gradually react to form superconducting oxides and thus the peaks disappear. In conclusion, the co-precipitate in accordance with these procedures is metal oxalate. At 450° C., the co-precipitate decomposes to form oxide or carbonates, and at 800° C., powder oxide superconducting material is formed.

Figure 6:
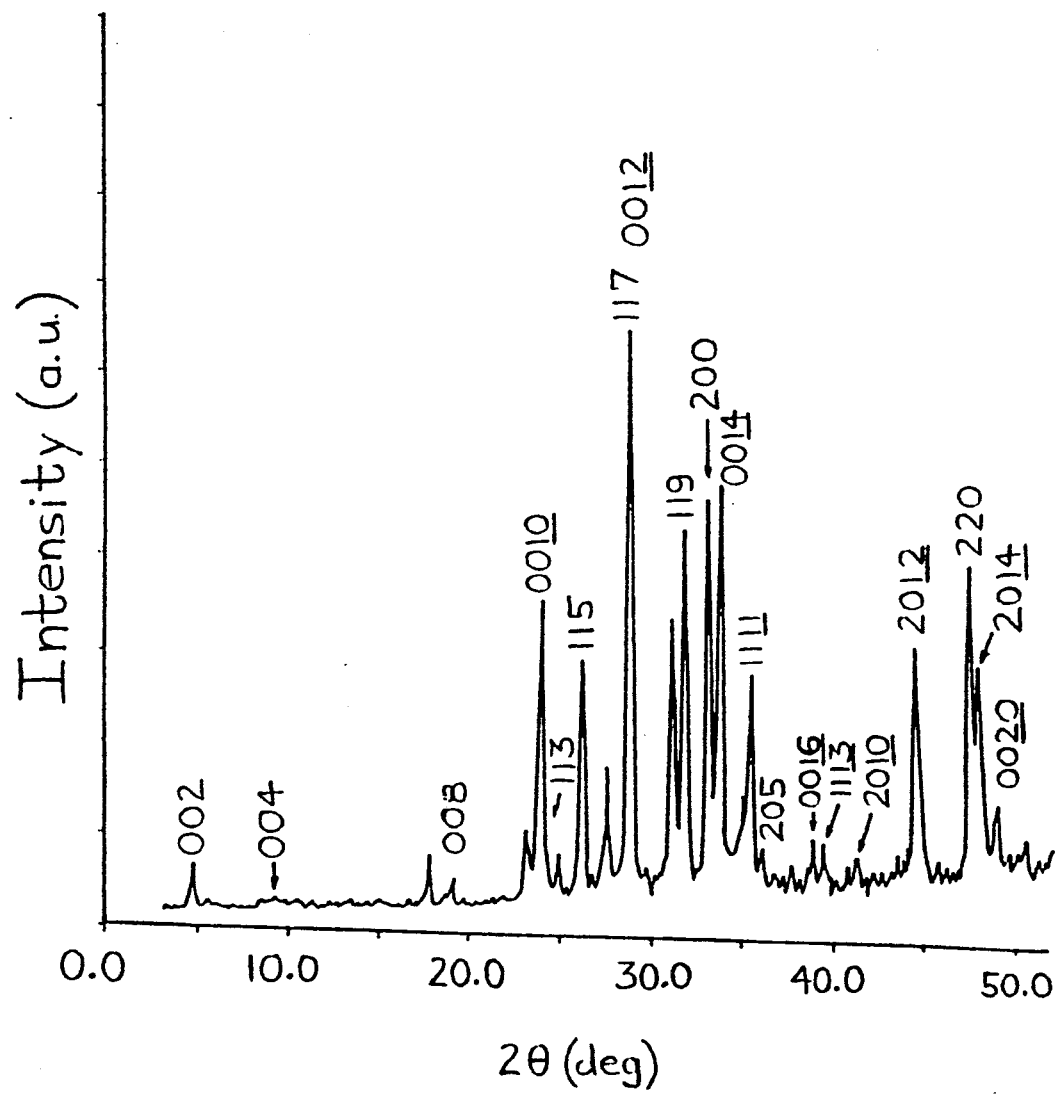
FIG. 6 illustrates the X-ray diffraction pattern for the superconductor in accordance with the present invention.
Figure 7:
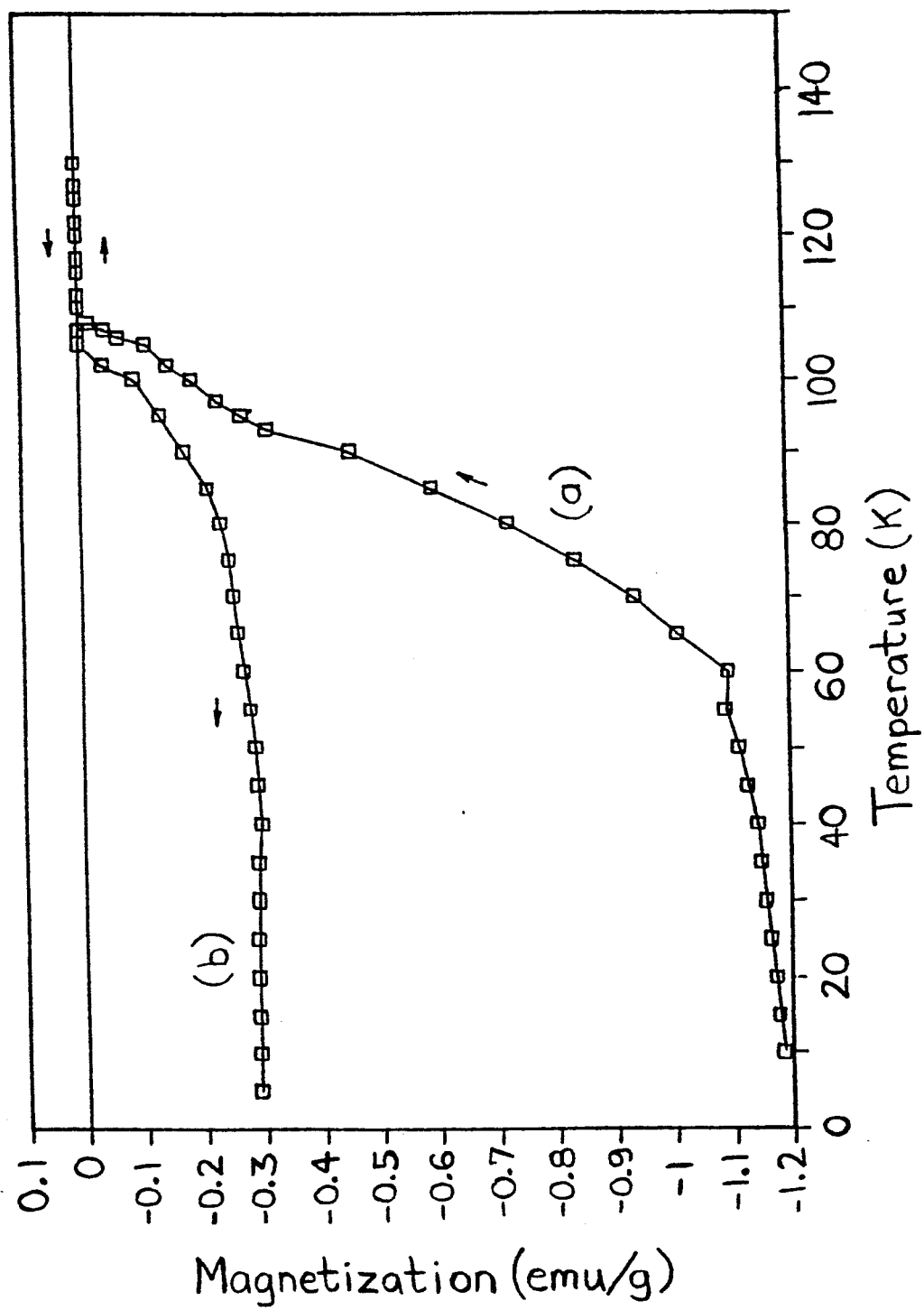
FIG. 7 illustrates the magnetization measured by SQUID (superconducting quantum-interference device).

The co-precipitate obtained from various ratios of triethyl amine/oxalic acid undergoes calcination at 800° C., and then undergoes grinding and compressing procedures to form a pellet. The pellet is sintered at 860° C. for 72 hours and cooled down to room temperature. By the method of four-point probe, the variation of resistance with temperature is determined. As shown in FIG. 5, when the ratio of triethyl amine/oxalic acid is 1.5 to 2.2, the critical temperature of the obtained co-precipitate after being sintered to obtain the oxide superconductor, is 105 to 110K. The oxide superconductor is then examined by X-ray diffraction. As shown in FIG. 6, it is found that the major components of the metal oxides are (2223) phase and the minor components are (2212) and $Ca_2PbO_4$. The product is then determined by SQUID and the results are shown in FIG. 7. The product is first cooled to 5K before a magnetic field of 100 Gauss is applied. The temperature is then increased to 130K and the magnetic field variation is determined. As shown in FIG. 7, curve (a) illustrates the zero field cooling curve (ZFC). The product is then cooled from 130K to 5K under a magnetic field of 100 Gauss and the magnetic field variation is determined. As shown in FIG. 7, curve (b) indicates the field cooling (FC) curve. In conclusion, FIG. 7 demonstrates that the present superconductor does posses diamagnetism properties at 100K.

The following examples are offered to assist the understanding of the present invention and are not to be construed as limiting its scope. Unless otherwise indicated, all parts and percentages are by weight.

In accordance with the present invention, the process for forming high temperature metal oxide superconductor of Bi-Pb-Sr-Ca-Cu-O type employs nitrates of Bi, Pb, Sr, Ca, and Cu as raw materials and by dissolving them in nitric acid solution to form an aqueous solution. Co-precipitate is formed by adding an appropriate proportion of triethylamine/oxalic acid. The co-precipitate obtained is then sintered at 860° C. to form a metal oxide superconductor having a critical temperature of 110K. The metal oxide thus formed is a very fine powder.

While only one embodiment of the present invention has been shown and described herein, it will be appreciated that modifications thereof, some of which have been alluded to above, may still be readily made thereto by those skilled in the art. We, therefore, intend by the appended claims to cover the modifications alluded to herein as well as all other modifications which fall within the true spirit and scope of our invention.

We claim:

1. A process for synthesizing high temperature oxide superconductor of Bi-Pb-Sr-Ca-Cu-O type comprising:
   (a) dissolving nitrate salts of Bi, Pb, Sr, Ca and Cu in nitric acid solution (>1.5M);
   (b) adding the obtained solution of (a) into an aqueous solution of triethylamine/oxalic acid (with molar ratio 1-3) component precipitant is readily obtained;
   (c) calcining the product obtained in (b) at 750° C.-800° C. for 10 hours to obtain the superconducting powder for further applications.

2. The process of claim 1 wherein the molar ratio of triethylamine/oxalic acid is from about 1 to about 2.5.

3. The process of claim 1 wherein the molar ratio of triethylamine to oxalic acid is from about 1.8 to about 2.2

* * * * *